United States Patent
Mandel et al.

(10) Patent No.: US 7,352,585 B2
(45) Date of Patent: Apr. 1, 2008

(54) FLIP CHIP HEAT SINK PACKAGE AND METHOD

(75) Inventors: Larry M Mandel, Nobelsville, IN (US); Kevin M. Gertiser, Noblesville, IN (US); Suresh K. Chengalva, Kokomo, IN (US); Dwadasi H. Sarma, Kokomo, IN (US); David W. Zimmerman, Fishers, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 11/583,316

(22) Filed: Oct. 19, 2006

(65) Prior Publication Data
US 2007/0064399 A1 Mar. 22, 2007

Related U.S. Application Data

(62) Division of application No. 10/683,015, filed on Oct. 10, 2003, now Pat. No. 7,180,745.

(51) Int. Cl.
*H05K 7/20* (2006.01)

(52) U.S. Cl. ............ 361/714; 361/704; 361/705; 361/707; 361/719; 257/712; 174/520; 174/526; 165/80.3; 165/104.33; 165/185; 29/840

(58) Field of Classification Search ........... 361/704, 361/707–710, 714, 719, 720, 715–716, 689, 361/690; 257/717–719, 706, 713; 29/840; 165/80.3, 185, 104, 21, 104.33; 174/15.2, 174/16.3, 50, 252
See application file for complete search history.

(56) References Cited

U.S. PATENT DOCUMENTS

| | | | |
|---|---|---|---|
| 5,307,236 A | * | 4/1994 | Rio et al. .............. 361/720 |
| 5,527,627 A | | 6/1996 | Lautzenhiser et al. ...... 428/615 |
| 5,608,610 A | | 3/1997 | Brzezinski |
| 5,949,648 A | * | 9/1999 | Liao .................. 361/700 |
| 6,008,536 A | | 12/1999 | Mertol ................ 257/704 |
| 6,043,981 A | * | 3/2000 | Markow et al. ........... 361/704 |

(Continued)

FOREIGN PATENT DOCUMENTS

EP 1 178 594 2/2002

(Continued)

OTHER PUBLICATIONS

Copy of EP Search Report dated Mar. 19, 2007.

(Continued)

*Primary Examiner*—Michael Datskovskiy
(74) *Attorney, Agent, or Firm*—Jimmy L. Funke

(57) ABSTRACT

An electronic package having enhanced heat dissipation is provided exhibiting dual conductive heat paths in opposing directions. The package includes a substrate having electrical conductors thereon and a flip chip mounted to the substrate. The flip chip has a first surface, solder bumps on the first surface, and a second surface oppositely disposed from the first surface. The flip chip is mounted to the substrate such that the solder bumps are registered with the conductors on the substrate. The package further includes a stamped metal heat sink in heat transfer relationship with the second surface of the flip chip. The heat sink includes a cavity formed adjacent to the flip chip containing a thermally conductive material.

16 Claims, 1 Drawing Sheet

U.S. PATENT DOCUMENTS

| | | | |
|---|---|---|---|
| 6,101,092 A * | 8/2000 | Onishi | 361/705 |
| 6,118,177 A | 9/2000 | Lischner et al. | |
| 6,180,436 B1 | 1/2001 | Koors et al. | 438/117 |
| 6,411,507 B1 * | 6/2002 | Akram | 361/690 |
| 6,545,871 B1 * | 4/2003 | Ramspacher et al. | 361/709 |
| 6,614,657 B2 | 9/2003 | Searls et al. | 361/704 |
| 6,681,482 B1 | 1/2004 | Lischner et al. | 29/840 |
| 6,696,643 B2 | 2/2004 | Takano | 174/520 |
| 6,809,932 B2 * | 10/2004 | Wu | 361/719 |
| 6,849,942 B2 | 2/2005 | Lin et al. | 257/712 |
| 6,881,077 B2 * | 4/2005 | Throum | 439/76.1 |
| 2001/0013640 A1 | 8/2001 | Tao | |
| 2001/0026957 A1 | 10/2001 | Atwood et al. | |
| 2003/0051868 A1 | 3/2003 | Dishongh et al. | |
| 2003/0134454 A1 | 7/2003 | Houle | |

FOREIGN PATENT DOCUMENTS

| | | |
|---|---|---|
| JP | 2002353388 | 12/2002 |

OTHER PUBLICATIONS

"A Heat Sink With Thermal Capacitance" Research Disclosure, Mason Publications, Hampshire, GB, No. 432, Apr. 2000, p. 640, XP000968830 ISSN: 0374-4353 *the whole document*.

* cited by examiner

FLIP CHIP HEAT SINK PACKAGE AND METHOD

CROSS-REFERENCE TO RELATED APPLICATION

This application is a division of application Ser. No. 10/683,015 filed 10 Oct. 2003 now U.S. Pat. No. 7,180,745. This application is related to application Ser. No. 10/683,009 filed 10 Oct. 2003, entitled "SEMICONDUCTOR DEVICE HEAT SINK PACKAGE AND METHOD," filed on the same date.

TECHNICAL FIELD

The present invention generally relates to flip chip semiconductor devices and, more particularly, to a flip chip and heat sink assembly for dissipating heat away from the flip chip.

BACKGROUND OF THE INVENTION

Electronic packages, such as electronic control modules, generally contain fabricated electrical circuitry including electronic components such as transistors and resistors. The circuitry conducts electrical current which, in turn, generates thermal energy (i.e., heat) within the electronic package. Excessive heat build-up within certain electronic packages and other components within a module may lead to adverse effects including electrical circuit failure. Thus, it is desirable to dissipate heat away from the electronic package.

Many electronic packages employ semiconductor devices in the form of a flip chip. Some conventional techniques for dissipating thermal energy from the electronic package employ a thermally conductive heat sink supported in contact with the package via clamps, or directly mount the heat sink onto a printed circuit board. One approach for conducting heat from a flip chip is disclosed in U.S. Pat. No. 6,180,436, the entire disclosure of which is hereby incorporated herein by reference. The aforementioned approach employs a flip chip mounted on a flexible substrate, having a heat-conductive member brought into thermal contact with one surface of the flip chip, and a biasing member for biasing the one surface of the flip chip against the heat-conductive member.

While conventional approaches generally suffice to dissipate some of the thermal energy (heat) away from the semiconductor device, many approaches do not offer optimal heat dissipation. For example, many approaches achieve a substantial amount of heat dissipation in one general direction, primarily by placing a heat sink in thermal contact with one surface of the semiconductor device. While some additional heat dissipation may be achieved in other directions through air or some other medium exhibiting poor thermal conductivity, such heat dissipation is generally minimal. The resultant heat dissipation realized in many conventional semiconductor packages results in size and power limitations.

Accordingly, it is therefore desirable to provide for a semiconductor device and heat sink package and method of dissipating thermal energy (heat) away from the flip chip semiconductor device in an optimal manner.

SUMMARY OF THE INVENTION

According to one aspect of the present invention, an electronic package having enhanced heat dissipation is provided. The package includes a substrate having electrical conductors thereon and a flip chip mounted to the substrate. The flip chip has a first surface, solder bumps on the first surface, and a second surface oppositely disposed from the first surface. The flip chip is mounted to the substrate such that the solder bumps are registered with the conductors on the substrate. The package further includes a heat sink in heat transfer relationship with the second surface of the flip chip. The heat sink includes a cavity formed in a region adjacent to the flip chip.

According to a further aspect of the present invention, a method of conducting heat from a flip chip is provided. The method includes the steps of providing a substrate having electrical conductors thereon, and mounting a flip chip to the substrate. The flip chip has a first surface, solder bumps on the first surface, and a second surface oppositely disposed from the first surface. The flip chip is mounted to the substrate such that the solder bumps are registered with the conductors on the substrate. The method further includes the step of attaching a heat sink in heat transfer relationship to the second surface of the heat sink, wherein the heat sink has a cavity formed in a region adjacent to the flip chip. In yet a further aspect of the invention, a thermally conductive material is disposed at least partially within the cavity in the heat sink.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENT

Figure 1:
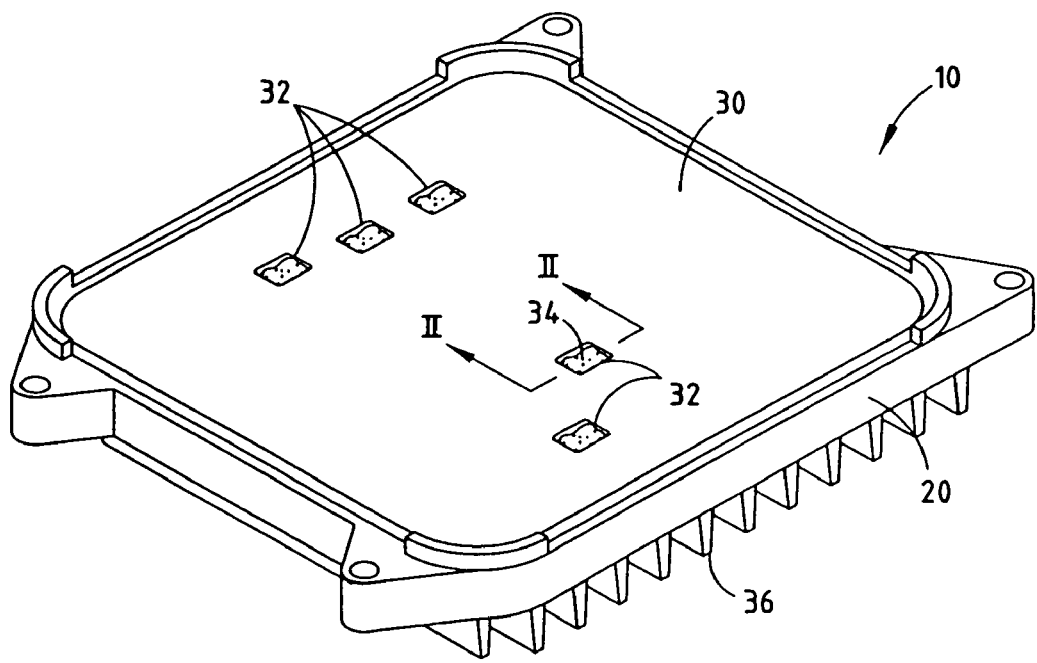
FIG. 1 is a perspective view of an electronic package containing flip chip and heat sink assemblies.

Referring to FIG. 1, an electronic package 10 is generally illustrated having a lower case 20 and an upper cover 30 forming an enclosure containing electrical circuitry. The electronic package 10 may be employed as an electronic control module (ECM) for use on a vehicle, according to one example. The electronic package 10 has a plurality of semiconductor devices mounted onto one or more circuit boards within the enclosure. In the example shown, the electronic package 10 includes a plurality of semiconductor devices mounted to a substrate 16 (refer to FIG. 2); however, it should be appreciated that one or more semiconductor devices may be mounted on one or more substrates and arranged in a thermally (heat) conductive relationship with one or more heat sinks according to the present invention. While the electronic package 10 is shown substantially enclosed, it should be appreciated that package 10 may be otherwise configured with the semiconductor devices not enclosed within a surrounding case and cover.

Figure 2:
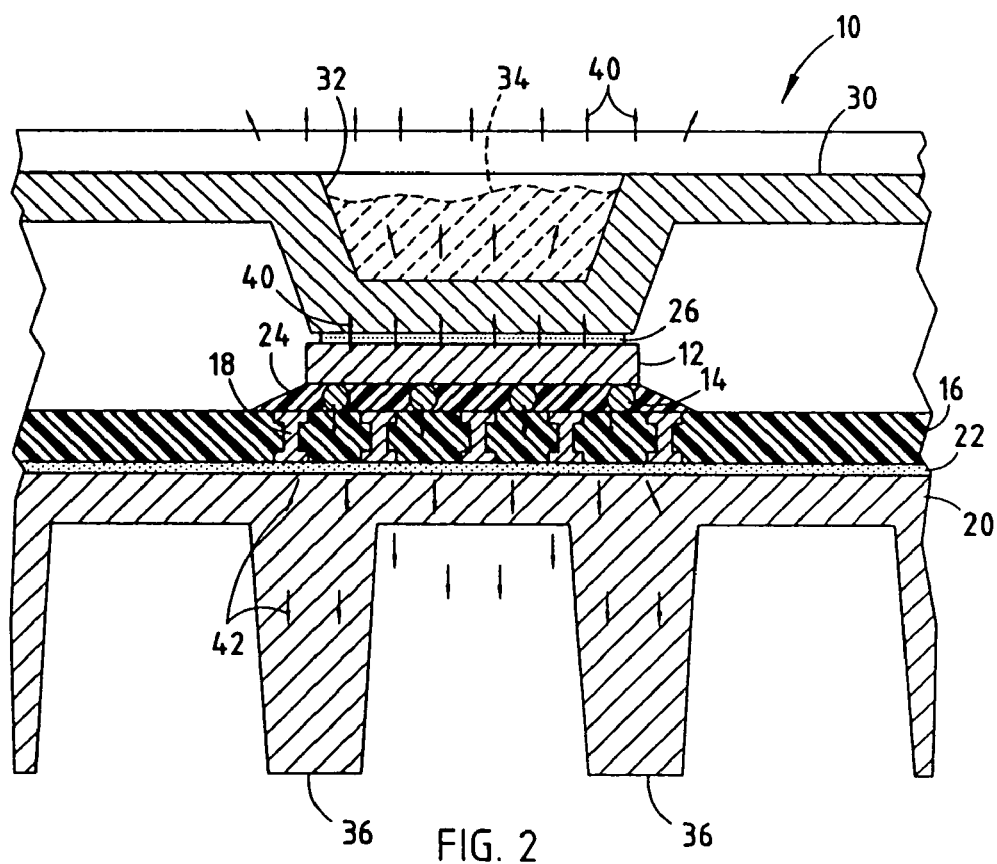
FIG. 2 is a cross-sectional view taken through lines II-II in FIG. 1 illustrating a flip chip and heat sink assembly according to the present invention.

Referring to FIG. 2, a portion of the electronic package 10 including a single flip chip semiconductor device 12 is shown in a conductive heat transfer relationship with the case 20 and cover 30. The electronic package 10 includes a semiconductor device in the form of a flip chip 12 mounted on the upper surface of substrate 16. The substrate 16 has electrical conductors formed on the upper surface which may extend across the upper surface and/or through substrate 16. The flip chip 12 has a first surface on the upper side, and a second surface oppositely disposed from the first surface on the bottom side. Solder bumps 14 extend from the lower surface of flip chip 12 and are electrically coupled to electrical circuitry within flip chip 12. The flip chip 12 is mounted to the substrate 16 such that the solder bumps 14 are registered with the electrical conductors on the upper side of substrate 16.

The flip chip 12 is a power dissipating semiconductor device generally having electrical circuitry, such as integrated circuitry, intended to conduct electrical current. For example, the flip chip 12 may include one or more transistors configured to provide a controlled switching operation, operate as a diode, or provide voltage regulation. When electrical current passes through the electrical circuitry in the flip chip 12, thermal energy (heat) is typically generated within the flip chip 12 due to electrical resistance. Flip chip 12 may include any known die configurations and may be employed in an electronic control module for use in a fluid environment, such as on an automotive vehicle. Flip chips are widely known in the electronics industry.

The substrate 16 may include any known substrate material, such as FR4 or ceramic material, and may be provided as a laminated circuit board, such as a printed circuit board having printed circuitry as is generally known in the art. Alternately, the substrate 16 may be provided as a wiring board. It should be appreciated that the substrate 16 may include electrical circuitry formed on the top surface thereof and extending therethrough, including circuitry formed in intermediate layers and on the bottom surface. The substrate 16 may be formed of a rigid or flexible material. It is also contemplated that substrate 16 may have electrical circuitry formed on the bottom surface and a recessed cavity to allow placement of one or more semiconductor devices, such as flip chips, onto the bottom surface.

Disposed between the second (lower) surface of flip chip 12 and upper surface of substrate 16 and surrounding solder bumps 14 is dielectric underfill material 24. The underfill material 24 is an electrically non-conductive dielectric material, such as a polymeric material, used to promote the thermal cycle life of the solder bumps 14. The underfill material 24 may include an epoxy resin, according to one example.

Extending through the entire thickness of substrate 16 are a plurality of thermally conductive vias 18, which are located in a region directly beneath flip chip 12. Thermally conductive vias 18 serve as an interface material to allow enhanced transfer of thermal energy (heat) from flip chip 12 through substrate 16 in a downward conductive heat transfer path 42. The conductive vias 18 may be used exclusively for thermal energy transfer or for both interconnecting electrical circuitry and thermal energy transfer.

Attached to the bottom surface of substrate 16 is the case 20, which is thermally conductive and may be made of a die cast metal. The die cast case 20 may be made of any suitable thermally conductive material such as an aluminum alloy (e.g., aluminum alloy 380). The die cast case 20 serves as a thermally conductive member to conduct heat dissipated by flip chip 12 to the surrounding environment.

The die cast case 20 is further shown having a plurality of upstanding cooling fins 36, generally made of the same thermally conductive material as the die cast case 20. Examples of the die cast case 20 may include a die cast aluminum alloy, such as aluminum alloy 380, for transmitting thermal energy received from the flip chip 12 to the surrounding environment. The cooling fins 36 provide a large surface area for dispensing the thermal energy to a fluid (e.g., air) in the surrounding environment by way of convection.

The die cast case 20 is adhered to the bottom surface of substrate 16 via a thermally conductive substrate interface material 22, such as a thermally conductive adhesive. One example of a substrate interface adhesive material 22 is Acrylic very high bond adhesive F 9469PC, commercially available from 3M. Another example of a suitable thermal tape is Thermattach T413, commercially available from Chomerics, a Division of Parker Hannifin Corporation. Other examples of suitable adhesives include T3033, commercially available from Isola Transtherm, and 1-4174 dispensable adhesive commercially available from Dow Corning Corp.

Disposed in heat transfer relationship with the upper surface of flip chip 12 is the cover 30 in the form of a stamped metal heat sink. Heat sink 30 is in heat transfer relationship with the upper surface of flip chip 12, and is separated from flip chip 12 by an interface material 26. The interface material 26 is a thermally conductive material and may include a thermally conductive gel, grease, or a thermally conductive adhesive. Examples of a grease interface material 26 include heat sink compounds commercially available under the trade name Chemplex. The use of a gel, in the form of a grease, as interface material 26 allows for heat transfer and movement between the upper surface of flip chip 12 and lower surface of heat sink 30. One example of an adhesive for use as the interface material 26 includes MT-220 low stress, high thermal conductivity adhesive, commercially available from Thermoset, Lord Chemical Products. Another example of a suitable adhesive is 1-4173 thermally conductive elastomer, commercially available from Dow Corning Corp. The use of an adhesive as interface material 26 maintains the positioning of heat sink 30 fixed relative to flip chip 12. Alternately, the interface material 26 may include a gap filler commercially available from Bergquist, or a graphite filled epoxy such as Advanced Thermal Transfer Adhesive (ATTA), commercially available from Btech Corporation (Browne Technology, Inc.).

The stamped metal heat sink 30 may be formed as a metal cover which, according to one embodiment, may be rigidly attached to the die cast case 20. However, the heat sink 30 and die cast case 20 may alternately be attached to electronic package 10.

The heat sink 30 is formed by stamping sheet metal, such as aluminum alloy 5052, to form one or more recessed cavities 32 in the upper surface. Each recessed cavity 32 is formed so as to be located adjacent to the flip chip 12. In the embodiment shown, the recessed cavity 32 is located above the flip chip 12 such that the recessed walls form a pedestal above the upper surface of flip chip 12.

Each cavity 32 may at least be partially filled with a thermally conductive material 34. The thermally conductive material 34 is a highly conductive heat transfer material that enhances the heat conduction and heat convection for heat removal from flip chip 12. The highly conductive material 34 has enhanced thermal conductivity as compared to the heat sink 30. Examples of the highly conductive material 34 include TC material, compacted metal/ceramic powders, phase change materials (e.g., for transients), and other materials having enhanced thermal conductivity.

The thermally conductive material 34 has high thermal conductivity and is able to withstand long term exposure in a typical automotive environment, and should be sufficiently resilient to separation from the cover 30 and flip chip 12. The thermally conductive material 34 may or may not be electrically insulative. Examples of thermally conductive material 34 include metal inserts such as aluminum alloys (e.g., aluminum alloy 5052), and metal/ceramic powder inserts such as silicon nitride and aluminum nitride. The thermally conductive material 34 may be in the form of a solder, such as a solder paste, e.g., 63% tin/37% lead or 10% tin/90% lead. The thermally conductive material 34 may include a phase change material such as PC2500, commercially available from Dow Chemical.

While the heat sink 30 is generally shown in one configuration, it should be appreciated that the heat sink 30 may be configured in other shapes and sizes. The upper surface of the stamped metal cover 30 may further include upstanding cooling fins (not shown) to enhance the surface area for dispensing the heat via convection to the surrounding fluid environment.

It should be appreciated that the heat sink cover 30 with cavity 32 and high thermally conductive material 34 advantageously provides for an enhanced first heat dissipation conductive path 40 which transfers heat from flip chip 12 upwards through heat sink 30 to the surrounding environment. Additionally, the electronic package 10 has a second heat dissipation conductive path 42 which flows downward from flip chip 12 through conductive vias 14 and substrate 16 and through die cast case 20 and cooling fins 36 to the surrounding environment from the bottom of the package 10. Thus, enhanced cooling is realized with the dual path conductive heat transfer of the present invention. Enhanced cooling is achieved with the present invention eliminates the costly methods required for convective and radiation heat transfer. This advantageously allows power semiconductors to be packaged in smaller devices and/or designed with enhanced power consumption.

It will be understood by those who practice the invention and those skilled in the art, that various modifications and improvements may be made to the invention without departing from the spirit of the disclosed concept. The scope of protection afforded is to be determined by the claims and by the breadth of interpretation allowed by law.

The invention claimed is:

1. A method for conducting heat from a flip chip, the method comprising the steps of:
   securing a substrate to a thermally conductive case, the substrate having a plurality of thermally conductive vias passing therethrough, the plurality of thermally conductive vias providing a thermal path from one side of the substrate to another side of the substrate;
   mounting a flip chip to the substrate, the flip chip having a first surface, solder bumps on the first surface, and a second surface oppositely disposed from the first surface, the flip chip being mounted to the substrate such that the solder bumps are registered with the plurality of thermally conductive vias; and
   attaching a heat sink in heat transfer relationship to the second surface of the flip chip, wherein the heat sink has a cavity formed in a region adjacent to the flip chip and the heat sink forming a cover for the thermally conductive case, the thermally conductive case providing a first thermal conductive path from the flip chip via the plurality of thermally conductive vias and the heat sink providing a second thermal conductive path from the flip chip via the cavity.

2. The method as defined in claim 1 further comprising the step of disposing a thermally conductive material within the cavity of the heat sink.

3. The method as defined in claim 1 further comprising the step of forming the heat sink by stamping sheet metal to form the cavity.

4. The method as defined in claim 1 wherein the thermally conductive case further comprises a plurality of cooling fins.

5. The method as defined in claim 1, wherein the step of attaching further comprises adhering a surface of the heat sink to the second surface of the flip chip.

6. The method as defined in claim 1 further comprising the step of placing a thermally conductive lubricant between the second surface of the flip chip and the heat sink.

7. The method as in claim 4, wherein the thermally conductive case is formed from a die cast metal.

8. The method as in claim 7, wherein the die cast metal is an aluminum alloy.

9. The method as in claim 1, wherein the solder bumps are surrounded by an electrically non-conductive underfill material.

10. The method as in claim 1, wherein the solder bumps are surrounded by an electrically non-conductive underfill material and the first surface of the flip chip is spaced away from the substrate.

11. A method for providing at least two discrete thermal conductive paths for a plurality of semi-conductor devices of an electronic package, the method comprising:
   securing a substrate of the electronic package to a thermally conductive case having a plurality of cooling fins and a peripheral wall, the peripheral wall defining a perimeter of an area receiving the substrate, the substrate having a plurality of thermally conductive vias passing therethrough, the plurality of thermally conductive vias providing a thermal path from one side of the substrate to another side of the substrate;
   mounting the plurality of semi-conductor devices to the substrate, each of the plurality of semi-conductor devices having a first surface, a plurality of solder bumps on the first surface, and a second surface oppositely disposed from the first surface, each of the plurality of semi-conductor devices being mounted to the substrate such that the plurality solder bumps are registered with a respective group of the plurality of thermally conductive vias;
   attaching a heat sink cover to the thermally conductive case, the heat cover having a plurality of cavities each being in heat transfer relationship with respect to the second surface of a respective one of the plurality of semi-conductor devices, the thermally conductive case providing a first thermal conductive path for each of the plurality of semi-conductor device via the plurality of thermally conductive vias and the heat sink cover providing a second thermal conductive path for each of the plurality of semi-conductor devices via a respective one of the plurality of cavities; and
   filling each of the plurality of cavities with a thermally conductive material.

12. The method as in claim 11, wherein the thermally conductive case is formed from a die cast metal.

13. The method as in claim 12, wherein the die cast metal is an aluminum alloy.

14. The method as in claim 11, wherein each of the plurality of semi-conductor devices are secured to the substrate by an electrically non-conductive underfill material, the electrically non-conductive underfill material surrounding each of the plurality of solder bumps.

15. The method as in claim 11, wherein the cover fits within the area defined by the peripheral wall of the thermally conductive case.

16. The method as in claim 11, wherein each of the plurality of solder bumps are surrounded by an electrically non-conductive underfill material and the first surface of each of the plurality of semi-conductor devices is spaced away from the substrate.

* * * * *